(12) United States Patent
Liu et al.

(10) Patent No.: US 10,559,560 B2
(45) Date of Patent: Feb. 11, 2020

(54) SEMICONDUCTOR ELECTROSTATIC DISCHARGE PROTECTION DEVICE

(71) Applicant: Nanya Technology Corporation, New Taipei (TW)

(72) Inventors: Fang-Wen Liu, New Taipei (TW); Tseng-Fu Lu, New Taipei (TW); Wei-Ming Liao, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 16/229,802

(22) Filed: Dec. 21, 2018

(65) Prior Publication Data
US 2019/0131294 A1  May 2, 2019

Related U.S. Application Data

(62) Division of application No. 15/794,834, filed on Oct. 26, 2017, now Pat. No. 10,242,978.

(51) Int. Cl.
*H01L 27/02* (2006.01)
*H01L 49/02* (2006.01)

(52) U.S. Cl.
CPC ...... *H01L 27/0266* (2013.01); *H01L 27/0274* (2013.01); *H01L 27/0277* (2013.01); *H01L 27/0288* (2013.01); *H01L 28/20* (2013.01); *H01L 28/40* (2013.01)

(58) Field of Classification Search
CPC ..... H01L 51/56; H01L 43/08; H01L 51/0097; H01L 43/12; H01L 51/0072
USPC .................................................. 257/296
See application file for complete search history.

(56) References Cited

U.S. PATENT DOCUMENTS

| | | | |
|---|---|---|---|
| 2008/0179681 A1 | 7/2008 | Kwak | |
| 2010/0090283 A1* | 4/2010 | Langguth | H01L 27/0262 257/355 |
| 2011/0121394 A1 | 5/2011 | Su et al. | |
| 2014/0362482 A1 | 12/2014 | Huang et al. | |
| 2016/0372456 A1 | 12/2016 | Yoo et al. | |

FOREIGN PATENT DOCUMENTS

| | | |
|---|---|---|
| CN | 202888176 U | 4/2013 |
| TW | 201729392 A | 8/2017 |

* cited by examiner

*Primary Examiner* — Andy Huynh
(74) *Attorney, Agent, or Firm* — Muncy, Geissler, Olds & Lowe, P.C.

(57) ABSTRACT

The present disclosure provides a semiconductor ESD protection device. The semiconductor ESD protection device includes a substrate including a first conductivity type, a gate formed on the substrate, a source region and a drain region formed in the substrate, and a body region formed in the substrate. The substrate and the body region include a first conductivity type. The source region and the drain region include a second conductivity type. And the first conductivity type and the second conductivity type are complementary to each other. The body region is electrically connected to the gate.

6 Claims, 4 Drawing Sheets

SEMICONDUCTOR ELECTROSTATIC DISCHARGE PROTECTION DEVICE

PRIORITY CLAIM AND CROSS-REFERENCE

This application is a divisional application of U.S. patent application Ser. No. 15/794,834, filed on Oct. 26, 2017. The entirety of the above-mentioned patent application is hereby incorporated by reference herein and made a part of this specification.

TECHNICAL FIELD

The present disclosure relates to a semiconductor electrostatic discharge (ESD) protection device.

DISCUSSION OF THE BACKGROUND

With the advancement of technology, a modern chip is allowed to have a plurality of various electronic circuits configured within the chip. For example, the integrated circuits (ICs) integrated in the chips can be divided into core circuits and input/output (I/O) circuits, and the core circuits and the I/O circuits are respectively driven by different power supply sources with different voltages. For receiving the externally provided power, pads for core circuits and I/O circuits are required.

It is found that electrostatic charges are easily transferred to the inner circuits in the chip by the pads during processes such as manufacturing, testing, packaging and delivering, etc. Such unwanted electrostatic charges, known as electrostatic discharge (ESD), impact and damage the inner circuits in the chip. As products based on ICs become more delicate, they also become more vulnerable to the impacts from external environment. Thus, ESD presents a constant threat to modern electronics.

As a countermeasure to the ESD issue, various ESD protection circuits and devices have been proposed. Typically, during a normal IC operation, the ESD protection device is turned off. However, when an ESD event occurs, the ESD protection device must be quickly triggered, so that the ESD currents are redirected and bypass the inner circuit. There is therefore a continuing need in the semiconductor processing art to develop an ESD protection device having lower trigger voltage that can be quickly turned on in order to render immediate protection to the inner circuit.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a semiconductor ESD protection device. The semiconductor ESD protection device includes a substrate including a first conductivity type, a gate formed on the substrate, a source region and a drain region formed in the substrate, and a body region formed in the substrate. The substrate and the body region include a first conductivity type. The source region and the drain region include a second conductivity type. The first conductivity type and the second conductivity type are complementary to each other. Further, the body region is electrically connected to the gate.

In some embodiments, the drain region is formed between the gate and the body region.

In some embodiments, the semiconductor ESD protection device further includes a first isolation structure formed in the substrate. The body region is separated from the drain region by the first isolation structure.

In some embodiments, a bottom surface of the source region, a bottom surface of the drain region and a bottom surface of the body region contact the substrate.

In some embodiments, the semiconductor ESD protection device further includes a first well region formed in the substrate, and the first well region includes the first conductivity type.

In some embodiments, the source region, the drain region and the body region are separated from the substrate by the first well region.

In some embodiments, a bottom surface of the source region, a bottom surface of the drain region and a bottom surface of the body region contact the first well region.

In some embodiments, the semiconductor ESD protection device further includes a doped region, a second well region and a deep well formed in the substrate, wherein the doped region, the second well region and the deep well include the second conductivity type.

In some embodiments, the semiconductor ESD protection device further includes a second isolation structure formed in the substrate, wherein the body region is separated from the doped region by the second isolation structure.

In some embodiments, the doped region is separated from the deep well by the second well region.

In some embodiments, a bottom surface of the doped region and at least a portion of a bottom surface of the second isolation structure contact the second well region.

In some embodiments, the first well region and the second well region are separated from the substrate by the deep well.

In some embodiments, a bottom surface of the first well region and a bottom surface of the second well region contact the deep well.

In some embodiments, the source region, the drain region and the body region are separated from the deep well and the substrate by the first well region.

In some embodiments, a bottom surface of the source region, a bottom surface of the drain region and a bottom surface of the body region contact the first well region.

In some embodiments, the drain region is electrically connected to a first pad.

In some embodiments, the gate is electrically connected to the first pad through a capacitor.

In some embodiments, the source region is electrically connected to a second pad.

In some embodiments, the gate is electrically connected to the second pad through a resistor.

In some embodiments, the semiconductor ESD protection device further includes a wiring layer, and the body region is electrically connected to the gate by the wiring layer.

In the present disclosure, the body region includes the second conductivity type complementary to the source region and the drain region, and the body region is electrically connected to the gate. In some embodiments, the semiconductor ESD protection device is therefore a gate-coupling NMOS (GCNMOS) device with a substrate trigger. When an ESD event occurs, a small voltage is applied to the body region and then to the substrate from the gate. Consequently, a base voltage of a parasitic bipolar junction transistor (BJT) in the semiconductor ESD protection device is increased, and thus a base-emitter junction of the parasitic BJT is more forward biased. As a result, the trigger voltage is reduced.

Notably, a trigger voltage of the semiconductor ESD protection device provided by the present disclosure is less than half of trigger voltages of a gate-grounded NMOS (GGNMOS) device and a conventional GCNMOS device without the substrate trigger. Thus, turn-on speed of the semiconductor ESD protection device provided by the present disclosure is improved, and damage caused by an ESD event is avoided.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

DETAILED DESCRIPTION

Figure 1:
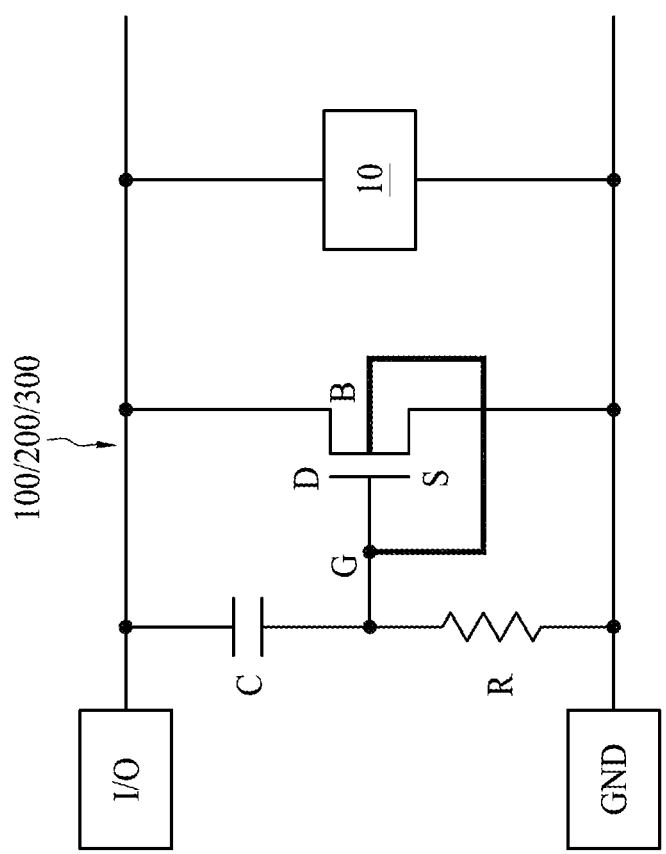
FIG. 1 is a circuit diagram of a semiconductor ESD protection device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
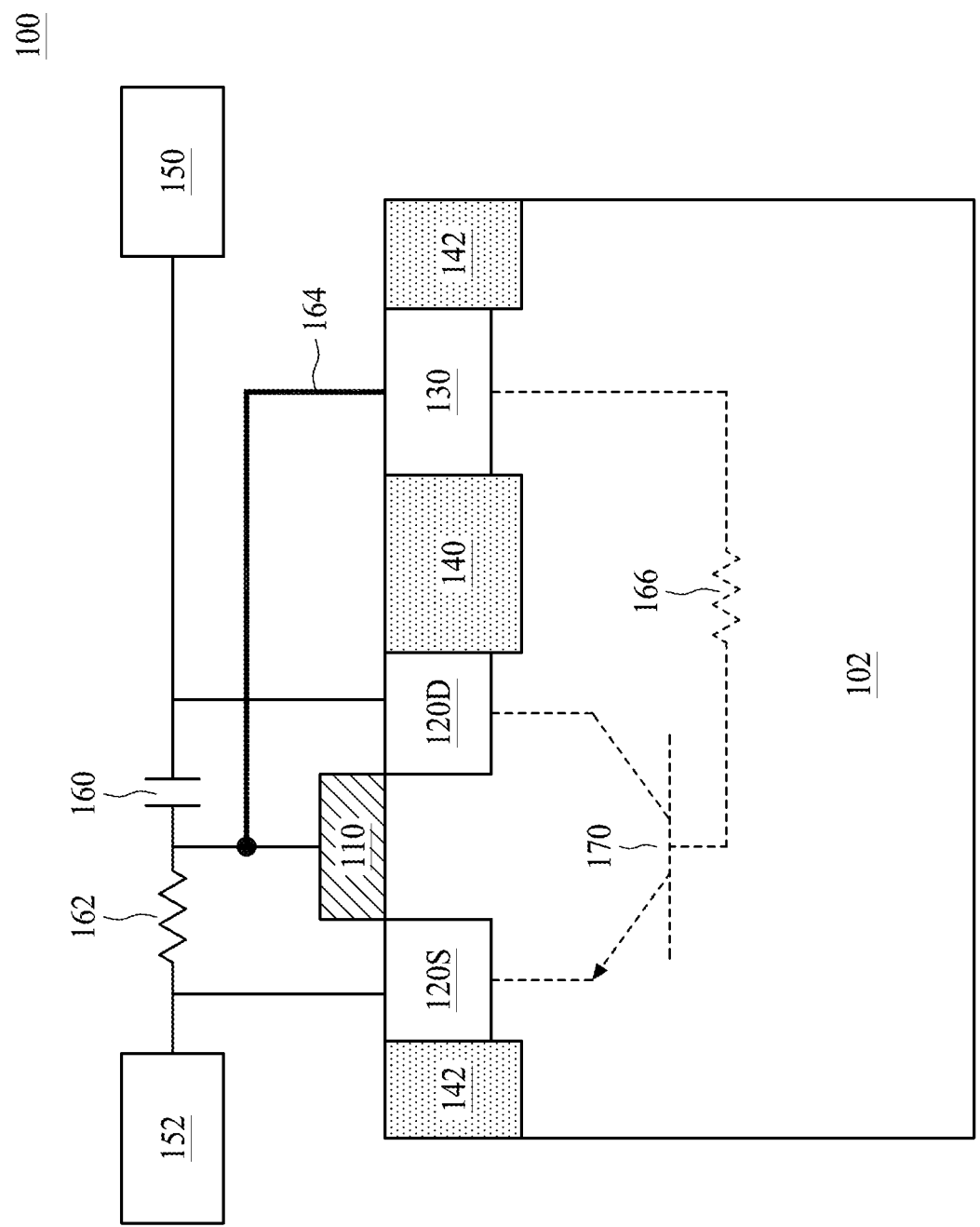
FIG. 2 is a schematic drawing illustrating a semiconductor ESD protection device in accordance with some embodiments of the present disclosure.

FIG. 1 is a circuit diagram of a semiconductor ESD protection device 100, 200 and 300 in accordance with some embodiments of the present disclosure. FIG. 2 is a schematic drawing illustrating a semiconductor ESD protection device 100 in accordance with some embodiments of the present disclosure. The semiconductor ESD protection device 100 includes a substrate 102, a gate 110 formed on the substrate 102, a source region 120S and a drain region 120D formed in the substrate 102, and a body region 130 formed in the substrate 102. The gate 110 includes a gate conductive layer and a gate dielectric layer. Since materials for forming the gate conductive layer and the gate dielectric layer are well-known to those skilled in the art, those details are omitted in the interest of brevity. The substrate 102 and the body region 130 include a first conductivity type, and the source region 120S and the drain region 120D include a second conductivity type. In addition, the first conductivity type and the second conductivity type are complementary to each other. For example, the first conductivity type is a p type and the second conductivity type is an n type in accordance with the present disclosure. Accordingly, the present disclosure provides a p-substrate 102 with a heavily doped n+-source region 120S, a heavily doped n+-drain region 120D and a heavily doped p+-body region 130 formed therein.

Referring to FIG. 2, the source region 120S and the drain region 120D are formed at two opposite sides of the gate 110 while the drain region 120D and the body region 130 are formed at the same side of the gate 110 as shown in FIG. 2. Further, the drain region 120D is formed between the gate 110 and the body region 130. The semiconductor ESD protection device 100 includes a first isolation structure 140 formed in the substrate 102 for separating the body region 130 from the drain region 120D. Further, a second isolation structure 142 is formed in the substrate 102 to electrically isolate the semiconductor ESD protection device 100 from other devices. The first isolation structure 140 and the second isolation structure 142 can include a shallow trench isolation (STI), but the disclosure is not limited to this. In some embodiments, a bottom surface of the source region 120S, a bottom surface of the drain region 120D, and a bottom surface of the body region 130 contact the substrate 102 as shown in FIG. 2.

Referring to FIGS. 1 and 2, the semiconductor ESD protection device 100 is electrically connected to an internal circuit 10 in parallel. Further, the drain region (D in FIG. 1) 120D is electrically connected to a first pad 150 such as a power pad or an I/O pad (I/O in FIG. 1), and the gate (G in FIG. 1) 110 is electrically connected to the first pad 150 through a capacitor (C in FIG. 1) 160. The source region (S in FIG. 1) 120S is electrically connected to a second pad 152 such as a ground pad (GND in FIG. 1), and the gate 110 is electrically connected to the second pad 152 through a resistor (R in FIG. 1) 162. More importantly, the body region (B in FIG. 1) 130 is electrically connected to the gate 110. Specifically, the body region 130 is electrically connected to the gate 110 through a wiring layer 164. In some embodiments, the wiring layer 164 includes a metal layer. Accordingly, the drain region 120D, the gate 110 and the body region 130 are all electrically connected to the first pad 150 while the gate 110 and the body region 130 are electrically connected to the first pad 150 through the capacitor 160.

During an ESD event at the first pad 150, voltages at the gate 110, the drain region 120D and the body region 130 are all increased. If the voltage exceeds the avalanche breakdown voltage of a PN junction formed with the p-substrate 102 as a base and the n+-drain region 120D as a collector, a plurality of electron-hole pairs is produced in a depletion of the PN junction region, and the electrons flow to the collector. The holes flow to the p+-body region 130 through the p-substrate 102. As the current caused by the holes flows through a p-substrate resistor 166, a voltage drop is generated in the p-substrate 102 and causes a forward bias voltage applied across a PN junction between the n+-source region 120S as an emitter and the p-substrate 102 as the base. When the bias voltage becomes higher than a PN junction cut-in voltage, the holes flow from the n+-drain region 120D as a collector to the n+-source region 120S as an emitter while the electrons flow in reverse, thereby triggering an operation of a parasitic NPN bipolar junction transistor (NPN-BJT) 170.

It is worth noting that the semiconductor ESD protection device 100 further provides an RC circuit, in which the gate 110 is electrically connected to the first pad 150 through the capacitor 160 and to the second pad 152 through the resistor 162. The RC circuit applies a bias voltage to the gate 110, and the operation of the parasitic NPN-BJT 170 is therefore triggered at a voltage lower than the avalanche breakdown voltage. That is, the trigger voltage is reduced. In addition, since the body region 130 is electrically connected to the gate 110, the bias voltage is also applied to the body region 130. Consequently, the base voltage of the parasitic NPN-BJT 170 is increased, and a base-emitter junction of the parasitic NPN-BJT 170 is therefore more forward biased. As a result, the trigger voltage is further reduced. Accordingly, the semiconductor ESD protection device 100 provided by the present disclosure is a gate-coupling NMOS (GCNMOS) device with a substrate trigger. Notably, a trigger voltage of the semiconductor ESD protection device 100 provided by the present disclosure is less than half of trigger voltages of conventional GGNMOS devices and conventional GCNMOS devices without a substrate trigger.

Figure 3:
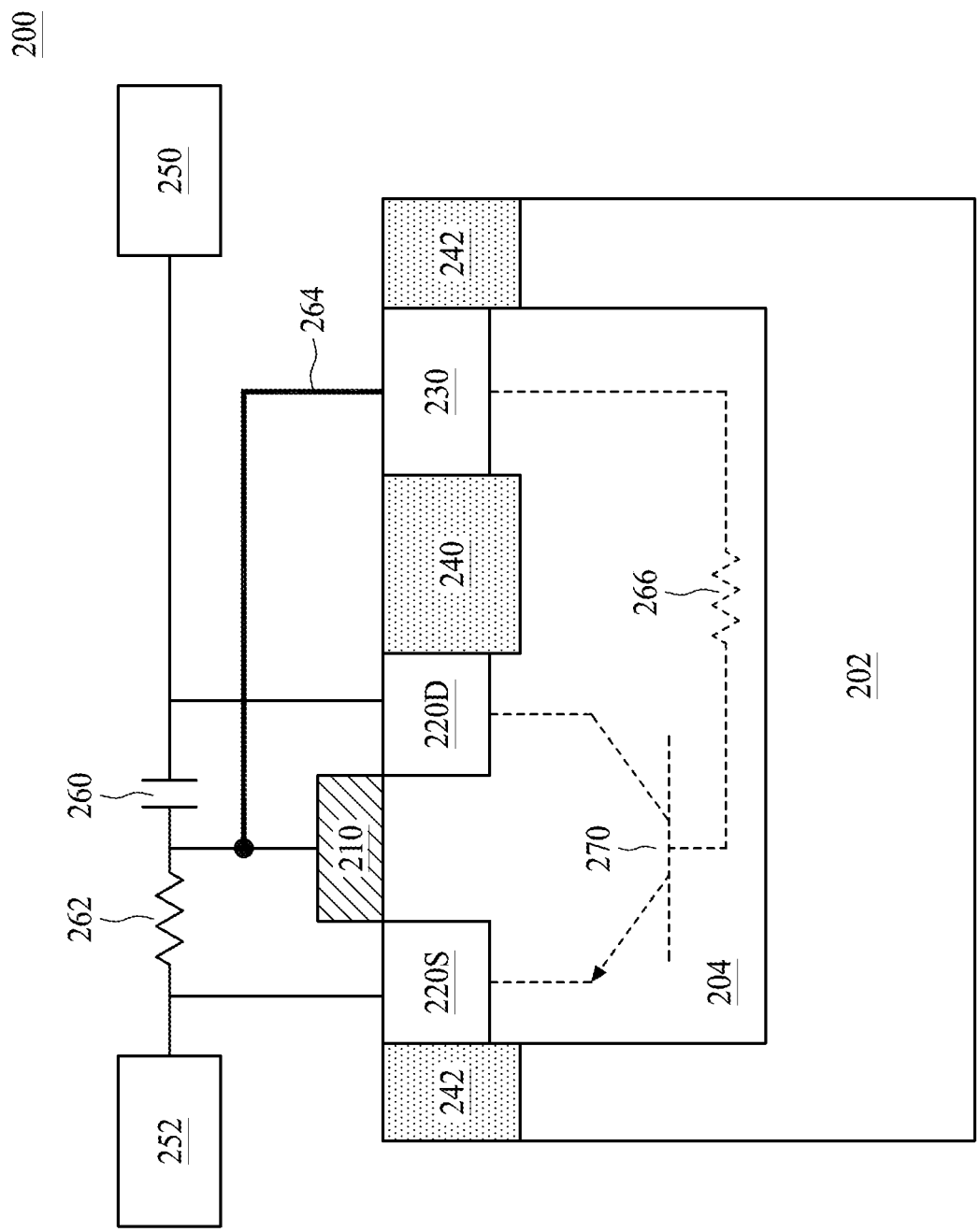
FIG. 3 is a schematic drawing illustrating a semiconductor ESD protection device in accordance with some embodiments of the present disclosure.

FIG. 3 is a schematic drawing illustrating a semiconductor ESD protection device 200 in accordance with some embodiments of the present disclosure. The semiconductor ESD protection device 200 includes a substrate 202, a gate 210 formed on the substrate 202, a source region 220S and a drain region 220D formed in the substrate 202, and a body region 230 formed in the substrate 202. Further, the semiconductor ESD protection device 200 provided by some embodiments includes a well region 204 formed in the substrate 202. The gate 210 includes a gate conductive layer and a gate dielectric layer. Since materials for forming the gate conductive layer and the gate dielectric layer are well-known to those skilled in the art, such details are omitted in the interest of brevity. The substrate 202, the well region 204 and the body region 230 include a first conductivity type, and the source region 220S and the drain region 120D include a second conductivity type. In addition, the first conductivity type and the second conductivity type are complementary to each other. For example, the first conductivity type is a p type and the second conductivity type is an n type in accordance with the present disclosure. Accordingly, the present disclosure provides a p-substrate 202 with a heavily doped n+-source region 220S, a heavily doped n+-drain region 220D, a p-well region 204, and a heavily doped p+-body region 230 formed therein. A concentration of the p-well region 204 is less than a concentration of the p+-drain region 220D.

Referring to FIG. 3, the source region 220S and the drain region 220D are formed at two opposite sides of the gate 210 while the drain region 220D and the body region 230 are formed at the same side of the gate 210, as shown in FIG. 3. Further, the drain region 220D is formed between the gate 210 and the body region 230. The semiconductor ESD protection device 200 includes a first isolation structure 240 formed in the substrate 202 for separating the body region 230 from the drain region 220D. Further, a second isolation structure 242 is formed in the substrate 202 to electrically isolate the semiconductor ESD protection device 200 from other devices. The first isolation structure 240 and the second isolation structure 242 can include an STI, but the disclosure not limited to this. In some embodiments, the source region 220S, the drain region 220D and the body region 230 are all formed in the well region 204, which is formed in the substrate 202, as shown in FIG. 3. The source region 220S, the drain region 220D and the body region 230 are separated from the substrate 202 by the well region 204. In some embodiments, a bottom surface of the source region 220S, a bottom surface of the drain region 220D, and a bottom surface of the body region 230 contact the well region 204.

Referring to FIGS. 1 and 3, the semiconductor ESD protection device 200 is electrically connected to an internal circuit 200 in parallel. Further, the drain region (D) 220D is electrically connected to a first pad 250 such as a power pad or an I/O pad (I/O), and the gate (G) 210 is electrically connected to the first pad 250 through a capacitor (C) 260. The source region (S) 220S is electrically connected to a second pad 252 such as a ground pad (GND), and the gate 210 is electrically connected to the second pad 252 through a resistor (R) 262. More importantly, the body region (B) 230 is electrically connected to the gate 210. Specifically, the body region 230 is electrically connected to the gate 210 through a wiring layer 264. In some embodiments, the wiring layer 264 includes a metal layer. Accordingly, the drain region 220D, the gate 210 and the body region 230 are all electrically connected to the first pad 250 while the gate 210 and the body region 230 are electrically connected to the first pad through the capacitor 260.

During an ESD event at the first pad 250, voltages at the gate 210, the drain region 220D and the body region 230 are all increased. If the voltage exceeds the avalanche breakdown voltage of a PN junction formed with the p-well region 204 as a base and the n+-drain region 220D as a collector, a plurality of electron-hole pairs is produced in a depletion of the PN junction region and the electrons flow to the collector. The holes flow to the p+-body region 230 through the p-well region 204. As the current caused by the holes flow through a p-well resistor 266, a voltage drop is generated in the p-well region 204 and causes a forward bias voltage applied across a PN junction between the n+-source region 220S as an emitter and the p-well region 204 as the base. When the bias voltage becomes higher than a PN junction cut-in voltage, the holes flow from the n+-drain region 220D as a collector to the n+-source region 220S as an emitter while the electrons flow in reverse, thereby triggering an operation of a parasitic NPN-BJT 270.

It is worthy noting that the semiconductor ESD protection device 200 further provides an RC circuit, in which the gate 210 is electrically connected to the first pad 250 through the capacitor 260 and to the second pad 252 through the resistor 262. The RC circuit applies a bias voltage to the gate 210, and the operation of the parasitic NPN-BJT 270 is therefore triggered at a voltage lower than the avalanche breakdown voltage. That is the trigger voltage is reduced. More importantly, since the body region 230 is electrically connected to the gate 210, the bias voltage is also applied to the body region 230. Consequently, the base voltage of the parasitic NPN-BJT 270 is increased, and a base-emitter junction of the parasitic NPN-BJT 270 is therefore more forward biased. As a result, the trigger voltage is further reduced. Accordingly, the semiconductor ESD protection device 200 provided by the present disclosure is a GCNMOS device with a substrate trigger. Notably, a trigger voltage of the semiconductor ESD protection device 200 provided by the present disclosure is less than half of trigger voltages of conventional GGNMOS devices and conventional GCNMOS devices without a substrate trigger.

Figure 4:
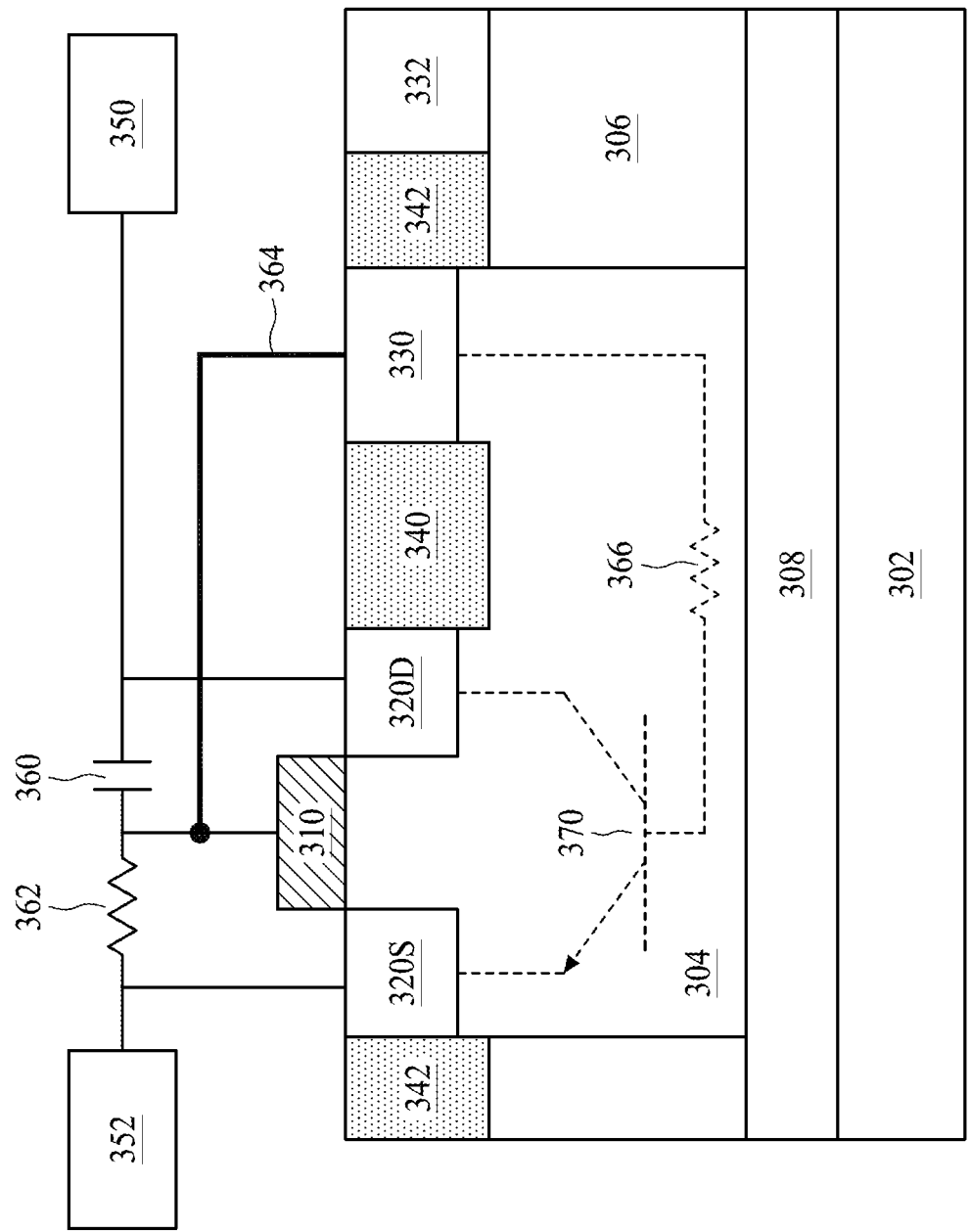
FIG. 4 is a schematic drawing illustrating a semiconductor ESD protection device in accordance with some embodiments of the present disclosure.

FIG. 4 is a schematic drawing illustrating a semiconductor ESD protection device 300 in accordance with some embodiments of the present disclosure. The semiconductor ESD protection device 300 includes a substrate 302, a gate 310 formed on the substrate 302, a source region 320S and a drain region 320D formed in the substrate 302, and a body region 330 formed in the substrate 302. Further, the semiconductor ESD protection device 300 provided by some embodiments includes a first well region 304, a second well region 306, a deep well 308, and a doped region 332 formed in the substrate 302. The gate 310 includes a gate conductive layer and a gate dielectric layer. Since materials for forming the gate conductive layer and the gate dielectric layer are well-known to those skilled in the art, such details are omitted in the interest of brevity. The substrate 302, the first well region 304 and the body region 330 include a first conductivity type, and the source region 320S, the drain region 320D, the doped region 332, the second well region 306 and the deep well 306 include a second conductivity type. In addition, the first conductivity type and the second conductivity type are complementary to each other. For example, the first conductivity type is a p type and the second conductivity type is an n type. Accordingly, the present disclosure provides a p-substrate 202 with a p-type first well region 304, an n-type second well region 306, an n-type deep well 308, a heavily doped n+-source region 320S, a heavily doped n+-drain region 320D, a heavily doped p+-body region 330, and a heavily doped n+-region 332 formed therein. A concentration of the p-type first well region 304 is less than a concentration of the p+-drain region 320D. A concentration of the n-type second well region 306 is less than a concentration of the n+-doped region 332, and greater than a concentration of the n-type deep well 308.

Referring to FIG. 4, the source region 320S and the drain region 320D are formed at two opposite sides of the gate 310 while the drain region 320D, the body region 330 and the doped region 332 are formed at the same side of the gate 110 as shown in FIG. 2. Further, the drain region 320D is formed between the gate 310 and the body region 330, and the body region 330 is formed between the gate 310 and the doped region 332. The semiconductor ESD protection device 300 includes a first isolation structure 340 formed in the substrate 302 for separating the body region 330 from the drain region 320D, and a second isolation structure 342 formed in the substrate 302 for separating the body region 330 from the doped region 332. The first isolation structure 340 and the second isolation structure 342 can include an STI, but the disclosure is not limited to this. In some embodiments, the source region 320S, the drain region 320D and the body region 330 are all formed in the first well region 304. The doped region 332 is formed in the second well region 306, and both of the first well region 304 and the second well region 306 are formed over the deep well region 308, which is formed in the substrate 302. The source region 320S, the drain region 320D and the body region 330 are separated from the deep well 304 and the substrate 302 by the first well region 304. The doped region 332 is separated from the deep well 308 by the second well region 306. The first well region 304 and the second well region 306 are separated from the substrate 302 by the deep well 308. In some embodiments, a bottom surface of the source region 320S, a bottom surface of the drain region 320D, and a bottom surface of the body region 330 contact the first well region 304. A bottom surface of the doped region 332 and at least a portion of a bottom surface of the second isolation structure 342 contact the second well region 306. A bottom surface of the first well region 304 and a bottom surface of the second well region 306 contact the deep well 308.

Referring to FIGS. 1 and 4, the semiconductor ESD protection device 300 is electrically connected to an internal circuit 10 in parallel. Further, the drain region (D) 320D is electrically connected to a first pad 350 such as a power pad or an I/O pad (I/O), and the gate (G) 310 is electrically connected to the first pad 350 through a capacitor (C) 360. The source region (S) 320S is electrically connected to a second pad 352 such as a ground pad (GND), and the gate 310 is electrically connected to the second pad 352 through a resistor (R) 362. More importantly, the body region (B) 330 is electrically connected to the gate 310. Specifically, the body region 330 is electrically connected to the gate 310 through a wiring layer 364. In some embodiments, the wiring layer 364 includes a metal layer. Accordingly, the drain region 320D, the gate 310 and the body region 330 are all electrically connected to the first pad 350 while the gate 310 and the body region 330 are electrically connected to the first pad through the capacitor 360.

During an ESD event at the first pad 350, voltages at the gate 310, the drain region 320D and the body region 330 are all increased. If the voltage exceeds the avalanche breakdown voltage of a PN junction formed with the p-type first well region 304 as a base and the n+-drain region 320D as a collector, a plurality of electron-hole pairs is produced in a depletion of the PN junction region and the electrons flow to the collector. The holes flow to the p+-body region 330 through the p-type first well region 304. As the current caused by the holes flow through a p-well resistor 366, a voltage drop is generated in the p-type first well region 304 and causes a forward bias voltage applied across a PN junction between the n+-source region 220S as an emitter and the p-type first well region 304 as the base. When the bias voltage becomes higher than a PN junction cut-in voltage, the holes flow from the n+-drain region 320D as a collector to the n+-source region 320S as an emitter while the electrons flow in reverse, thereby triggering an operation of a parasitic NPN-BJT 370.

It is worth noting that the semiconductor ESD protection device 300 further provides an RC circuit, in which the gate 310 is electrically connected to the first pad 350 through the capacitor 360 and to the second pad 352 through the resistor 362. The RC circuit applies a bias voltage to the gate 310, and the operation of the parasitic NPN-BJT 370 is therefore triggered at a voltage lower than the avalanche breakdown voltage. That is, the trigger voltage is reduced. More importantly, since the body region 330 is electrically connected to the gate 310, the bias voltage is also applied to the body region 330. Consequently, the base voltage of the parasitic NPN-BJT 370 is increased, and a base-emitter junction of the parasitic NPN-BJT 370 is therefore more forward biased. As a result, the trigger voltage is further reduced. Accordingly, the semiconductor ESD protection device 300 provided by the present disclosure is a GCNMOS device with a substrate trigger. Notably, a trigger voltage of the semiconductor ESD protection device 300 provided by the present disclosure is less than half of trigger voltages of conventional GGNMOS devices and conventional GCNMOS devices without a substrate trigger.

In the present disclosure, the body region 130/230/330 includes the second conductivity type complementary to the source region 120S/220S/230S and the drain region 120D/220D/320D, and the body region 130/230/330 is electrically connected to the gate 110/210/310. In some embodiments, the semiconductor ESD protection device 100/200/300 is therefore a GCNMOS device with a substrate trigger. When an ESD event occurs, a small voltage is applied to the body region 130/230/330 and then to the substrate 102 or the well region 204/304 from the gate 110/210/310. Consequently, the base voltage of the parasitic NPN-BJT 170/270/370 in the semiconductor ESD protection device 100/200/300 is increased, and thus a base-emitter junction of the parasitic NPN-BJT 170/270/370 is more forward biased. As a result, the trigger voltage is reduced.

In comparison, a trigger voltage of the semiconductor ESD protection device 100/200/300 provided by the present disclosure is less than half of trigger voltages of conventional GGNMOS devices and conventional GCNMOS devices without the substrate trigger. Thus, turn-on speed of the semiconductor ESD protection device 100/200/300 provided by the present disclosure is improved, and damage caused by ESD event is avoided. Additionally, formation of the body region 130/230/330, the doped region 332, the first well region 204/304, the second well region 306 and the deep well 308 can be integrated in the state-of-the-art semiconductor manufacturing process without increasing process complexity and cost.

One aspect of the present disclosure provides a semiconductor ESD protection device. The semiconductor ESD protection device includes a substrate including a first conductivity type, a gate formed on the substrate, a source region and a drain region formed in the substrate, and a body region formed in the substrate. The substrate and the body region include a first conductivity type. The source region and the drain region include a second conductivity type. The first conductivity type and the second conductivity type are complementary to each other. More importantly, the body region is electrically connected to the gate.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor electrostatic discharge (ESD) protection device comprising:
    a substrate comprising a first conductivity type;
    a gate disposed on the substrate;
    a source region and a drain region disposed in the substrate, the source region and the drain region comprising a second conductivity type complementary to the first conductivity type;
    a body region disposed in the substrate, the body region comprising the first conductivity type, wherein the drain region is formed between the gate and the body region; and
    an isolation structure formed in the substrate, the body region being separated from the drain region by the isolation structure;
    wherein the body region is electrically connected to the gate;
    wherein the drain region is electrically connected to a first pad;
    wherein the gate is electrically connected to the first pad through a capacitor; and
    wherein the body region is electrically coupled to a line formed between the gate and the capacitor.

2. The semiconductor ESD protection device of claim 1, wherein the source region is electrically connected to a second pad.

3. The semiconductor ESD protection device of claim 2, wherein the second pad is a ground pad.

4. The semiconductor ESD protection device of claim 1, wherein the gate is electrically connected to the second pad through a resistor.

5. A semiconductor electrostatic discharge (ESD) protection device comprising:
    a substrate comprising a first conductivity type;
    a gate disposed on the substrate;
    a source region and a drain region disposed in the substrate, the source region and the drain region comprising a second conductivity type complementary to the first conductivity type;
    a body region disposed in the substrate, the body region comprising the first conductivity type, wherein the drain region is formed between the gate and the body region;
    an isolation structure formed in the substrate, the body region being separated from the drain region by the isolation structure; and
    a wiring layer, the body region being electrically connected to the gate by the wiring layer;
    wherein the gate is electrically connected to the first pad through a capacitor;
    wherein the body region is electrically coupled to a line formed between the gate and the capacitor.

6. The semiconductor ESD protection device of claim 1, wherein the first pad is a power pad or an I/O pad.

* * * * *